United States Patent
Kong et al.

(10) Patent No.: US 6,242,973 B1
(45) Date of Patent: Jun. 5, 2001

(54) BOOTSTRAPPED CMOS DRIVER

(75) Inventors: Bai-Sun Kong; Dong-O Kang, both of Seoul (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/382,691

(22) Filed: Aug. 25, 1999

(30) Foreign Application Priority Data

Sep. 1, 1998 (KR) .................................................. 98-35877

(51) Int. Cl.[7] .................................................... H03K 17/16
(52) U.S. Cl. ............................................ 327/589; 327/390
(58) Field of Search ..................................... 327/589, 148, 327/157, 306

(56) References Cited

U.S. PATENT DOCUMENTS

| | | | |
|---|---|---|---|
| 5,568,081 | * 10/1996 | Lui et al. | 327/380 |
| 5,729,165 | * 3/1998 | Lou et al. | 327/112 |
| 5,790,612 | * 8/1998 | Chengson et al. | 327/148 |

* cited by examiner

*Primary Examiner*—Toan Tran
*Assistant Examiner*—Linh Nguyen
(74) *Attorney, Agent, or Firm*—Fleshner & Kim, LLP

(57) ABSTRACT

A bootstrapped CMOS driver for driving a large capacitive load, which employs a drive unit consisting of pull-up and pull-down devices, and a pull-up section and a pull-down section performing pull-up and pull-down operations, respectively, in accordance with a level of an input signal. The pull-up section and the pull-down section can be embodied as a plurality of MOS devices and dual bootstrap capacitors controlled by a single input signal or as a plurality of MOS devices and a single bootstrap capacitor controlled by two input signals.

16 Claims, 4 Drawing Sheets

BOOTSTRAPPED CMOS DRIVER

BACKGROUND OF THE INVENTION

1. Field of the Invention

The present invention relates to a CMOS driver for driving a large capacitive load, and more particularly to a bootstrapped CMOS driver for a low-voltage application.

2. Description of the Background Art

In general, a CMOS VLSI circuit having a large fan-out or a long interconnect metal line or a CMOS output pad driver have a considerably large capacitive load. Accordingly, design of a driver circuit for driving a large capacitive load is very important for the driver circuit itself determines an operation speed of the system.

FIG. 1 illustrates a conventional tapered CMOS driver 1 to drive a large capacitive output load. As shown therein, the tapered CMOS driver 1 consists of a chain of inverters each of which employs a large size transistor progressing toward to a load.

However, when being scaled a supply voltage to reduce power consumption, there is a problem in that the operation speed of the tapered CMOS driver 1 is considerably reduced, because a threshold voltage of a MOS device constituting each inverter can not be reduced at the same rate as the supply voltage. Accordingly, to overcome such a problem, there has been introduced a BiCMOS driver that uses a driving capacity of a bipolar device. But, to apply the bipolar device to the CMOS process technology, a high cost premium is required.

SUMMARY OF THE INVENTION

An object of the present invention is to provide a bootstrapped CMOS driver that improves a bootstrap efficiency.

Another object of the present invention is to provide a bootstrapped CMOS driver which is applicable at a relatively low voltage and which can be fabricated at a low cost.

To achieve these and other advantages and in accordance with the purpose of the present invention, as embodied and broadly described herein, there is provided a bootstrapped CMOS driver, which includes a drive unit consisting of pull-up and pull-down devices; and a bootstrap unit for boosting gate voltages of the pull-up and pull-down devices using a pull-up section and a pull-down section performing pull-up and pull-down operations, respectively, in accordance with a level of an input signal, wherein the pull-up section and the pull-down section can be embodied as a plurality of MOS devices and dual bootstrap capacitors controlled by a single input signal or as a plurality of MOS devices and a single bootstrap capacitor controlled by two input signals. Additional advantages, objects, and features of the invention will be set forth in part in the description which follows an in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE INVENTION

Figure 1:
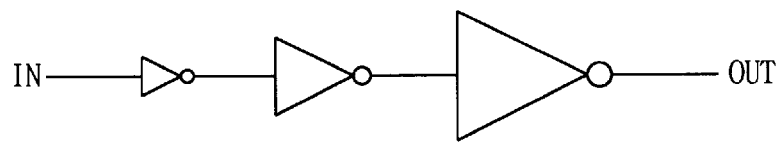
FIG. 1 is a diagram illustrating a conventional tapered CMOS driver.
Figure 2:
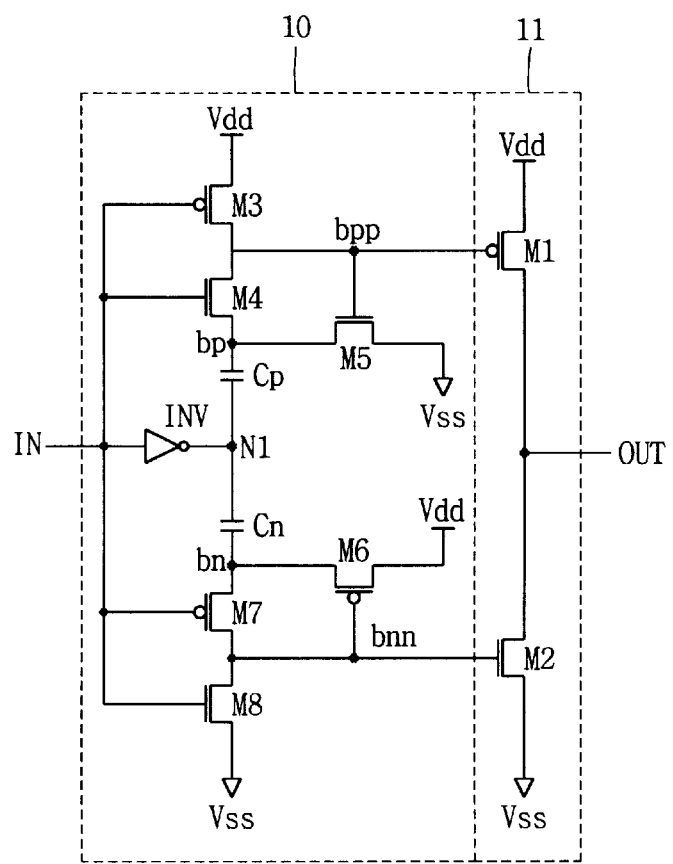
FIG. 2 is a diagram illustrating a bootstrapped CMOS driver according to a first embodiment of the present invention.

FIG. 2 is a diagram illustrating a bootstrapped CMOS driver according to a first embodiment of the present invention.

As shown therein, a bootstrapped CMOS driver 100 consists of a bootstrap and a drive unit 11. Specifically, the bootstrap 10 consists of three MOS devices M3,M4,M5 constituting a pull-up section, three MOS devices M6,M7,M8 constituting a pull-down section, a CMOS inverter INV and dual bootstrap capacitors Cp,Cn. The MOS devices M3,M4,M5 and the bootstrap capacitor Cp are used for boosting a node bpp in a pull-up operation, while the MOS devices M6,M7,M8 and the bootstrap capacitor Cn are used for boosting a node bnn in a pull-down operation. The drive unit 11 consists of a pull-up device M1 and a pull-down device M2 for driving an output node.

Now, an operation of the bootstrapped CMOS driver 100 according to the present invention will be described.

The pull-up operation is performed by the pull-section consisting of MOS devices M3,M4,M5 and the bootstrap capacitor Cp. Here, voltage levels of the bootstrap nodes bpp,bnn will be explained when an input signal IN is a low level before being transited to a high level 1.5V.

Since a power voltage Vdd is connected with the node bpp through the M3 device which is turned on when the input signal IN becomes the low level, the MOS device M5 and the pull-up device M1 are turned on and off, respectively. Accordingly, the node bp is grounded through the MOS device M5, the voltage of the node bp becomes a ground level 0V, and the node N1 is precharged to the power voltage level 1.5V in accordance with the input signal IN at the high level which has been inverted by the inverter INV.

In such a state, when the input signal IN is transited to the high level, the MOS devices M3,M4 are turned off and on, respectively, so that the node bpp is cut off from the power voltage Vdd and connected with the node bp. Accordingly, an electric charge over the node bpp is gradually discharged through the MOS devices M4,M5 until the MOS device M5 is turned off, and the voltage of the node N1 is pulled down in accordance with the input signal IN at the low level which has been inverted by the inverter INV. As a result, the voltage of the node bp becomes lower than the ground level by capacitance coupling between the nodes N1,bp. Here, since the nodes bp,bpp are connected to each other through the MOS device M4 which is turned on, the voltage of the node bpp is affected by the voltage of the node bp. Thus, the driving capacity of the pull-device M1 becomes larger than that of the other MOS devices in accordance with a high voltage difference between a gate and a source, and thus the output node thereof is rapidly pulled up by large volume of current supplied from the pull-up device M1. While, the pull-down operation is performed by the pull-down section consisting of the MOS devices M6,M7,M8 and the capacitor Cn.

During the pull-up operation, that is when the input signal IN is the high level 1.5V, the node bnn is turned on and connected with the ground through the MOS device M8, whereby the voltage of the node bnn becomes the ground level and the MOS device M6 is turned on. However, when the MOS device M6 is turned on, the node bn is connected with the power voltage Vdd and is precharged to the Vdd level. Here, the voltage of the node N1 is pulled down by the input signal IN at the low level which has been inverted by the inverter INV.

In such a state, when the input signal IN is transited to the low level, the MOS devices M7,M8 are turned on and turned off, respectively, whereby the node bnn is cut off from the ground and connected with the node bn. Thus, the electric charge is charged to the node bnn through the MOS device M7 until the MOS device M6 becomes turned off and the voltage of the node N1 is pulled up by the input signal IN at the high level which has been inverted by the inverter INV. Thus, the voltage of the node bn becomes higher than the power voltage Vdd in accordance with the capacitance coupling between the nodes N1,bn. Here, since the nodes bn,bnn are connected with each other through the MOS device M7 which is turned on, the voltage of the node bnn is affected by the voltage of the node bn. Thus, the driving capacity of the pull-down device M2 becomes greater than that of the other MOS devices in accordance with the high voltage difference between the gate and the source and accordingly the output node is rapidly pulled down by a great volume of a current supplied from the pulldown MOS device M2.

As described above, the bootstrapped CMOS driver 100 according to the first embodiment of the present invention improves the problem of the conventional tapered CMOS which is the decrease in speed thereof at the low voltage. Also, since the MOS devices are used in the first embodiment of the present invention, the bootstrapped CMOS driver according to the present invention has an advantage in that the fabricating cost is relatively low compared to the conventional BiCMOS driver using the bipolar. However, since the bootstrapped CMOS driver according to the first embodiment of the present invention includes the dual capacitors Cp,Cn to perform the pull-up and the pull-down operations, respectively, there is a problem of increase in a layout area.

Figure 3:
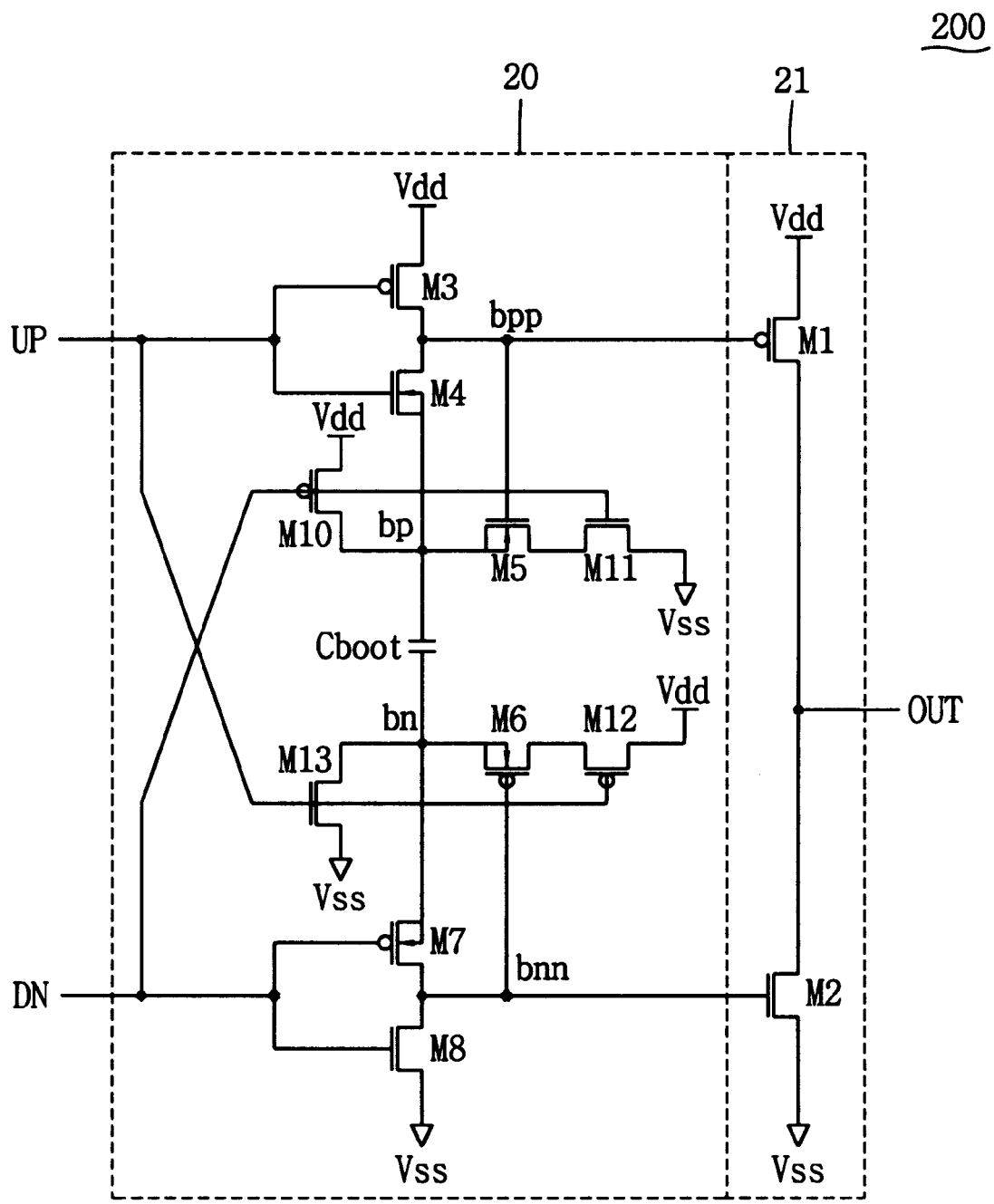
FIG. 3 is a diagram illustrating a bootstrapped CMOS driver according to a second embodiment of the present invention.

FIG. 3 illustrates a bootstrapped CMOS driver 200 which employs a single bootstrap capacitor Cboot according to a second embodiment of the present invention.

As shown therein, the bootstrapped CMOS driver 200 is provided with a bootstrap unit 20 and a drive unit 21. The elements which have the same configuration as in the first embodiment will have the same reference numbers. The bootstrapped CMOS driver 200 includes MOS devices M10, M11,M12,M13 in addition to the construction of the first embodiment of the present invention. In the bootstrap unit 20 MOS devices M3,M4,M5,M10,M11 and a bootstrap capacitor Cboot constituting a pull-up section are used to boost a node bpp and MOS devices M6,M7,M8,M12,M13 and a bootstrap capacitor Cboot constituting a pull-down section are used to boost a node bnn. Here, the bootstrap capacitor Cboot is used for pull-up and pull-down boosting operations.

The bootstrapped CMOS driver 200 has two input signals UP,DN. The signal UP is an active-high signal for a pull-up transition and the signal DN is an active-low signal for a pull-down transition. Bodies of the MOS devices M4,M5 in the pull-up section are connected with a node bn instead of a power voltage. As a result, an internal voltage undershoot in each of the nodes bp,bn does not lead to a forward bias in a source/drain-substrate junction.

The operation of the thusly provided bootstrapped CMOS driver 200 according to the present invention will now be described with reference to the accompanying drawing.

When the input signals UP,DN become low and high levels, respectively, the MOS devices M4,M7 are turned off, while the MOS devices M3,M8 are turned on, whereby logic values of the nodes bpp, bnn become high and low levels, respectively. Thus, the pull-up device M1 and the pull-down device M2 of the drive unit 21 are completely turned off and accordingly an output node thereof becomes a tri-state. Since the MOS devices M10,M13 are turned off and the MOS devices M5,M11,M6,M12 are turned on during such a state, the node bp is discharged to the ground level in advance and the node bn is precharged to a power supply voltage Vdd. Accordingly, a voltage difference same as the power supply voltage Vdd is applied both terminals of the bootstrap capacitor Cboot.

Here, assuming that the logic value of the output node is the low level at the initial state, the pull-up operation starts when the input signal UP is transited to the high level.

When the input signal UP becomes the high level, the MOS devices M3,M4 are turned off and on, respectively, so that the node bpp is cut off from the power voltage Vdd and connected with the node bp. Accordingly, the electric charge over the node bpp is gradually discharged through the MOS devices M4,M5,M11 until the MOS device M5 is turned off. Simultaneously, the MOS device M13 is turned on in accordance with the input signal UP at the high level and the voltage of the node bn is pulled down. Accordingly, the voltage of the node bp becomes lower than the ground level in accordance with the capacitance coupling between the nodes bn,bp. Here, since the nodes bp,bpp are connected with other through the turned-on MOS device M4, the voltage of the node bpp depends on the voltage of the node bp. As a result, the driving capacity of the pull-up device M1 becomes larger than that of the other MOS devices in accordance with a high voltage difference between the gate and the source and thus an output node is rapidly pulled up in accordance with great volume of a current supplied from the pull-up device M1. Then, the pull-up operation is completed and then the output node again becomes the tri-state when the input signal UP is transited to the low level.

While, the input signal DN must be transited to the low level to the low level to perform the pull-down operation which has a complementary type to the pull-up operation.

That is, when the input signal DN becomes the low level in the tri-state, the MOS devices M7,M8 are turned on and off, respectively, so that the node bnn is cut off from the ground and connected with the node bn. Thus, the electric charge over the node bn is charged to the node bnn through the MOS device M10 in accordance with the input signal DN at the low level. The MOS device M10 is turned on in accordance with the input signal DN at the low level and thus the voltage of the node bp is pulled up. Accordingly, the voltage of the node bn becomes higher than the power supply voltage Vdd in accordance with a capacitance coupling between the nodes bp,bn. Here, since the nodes bn,bnn are connected with each other through the turned-on MOS device M7, the voltage of the node bnn is affected by a voltage of the node bn. Accordingly, the driving capacity of the pull-down device M2 becomes larger than that of the other MOS devices and thus the output node is rapidly pulled down in accordance with the large volume of a current supplied from the pull-down device M2. When the pull-down operation is completed and when the input signal DN1s transited to the low level, the output node becomes the tri-state again.

To evaluate the performance of the provided driver, the bootstrapped CMOS driver 200, as shown in FIG. 3, is designed based on a 0.35 µm CMOS process technology. Channel widths of the pull-up device M1 and the pull-down device M2 are 20 µm and 10 µm, respectively. The devices M1,M2 have at least 0.35 µm of a channel length. Also, the bootstrap capacitor Cboot can be embodied using an NMOS device with a source and a drain connected with each other, width and length of which are to be 15 µm and 4 µm, respectively, to achieve the capacitance of 300 pF.

Figure 4A:
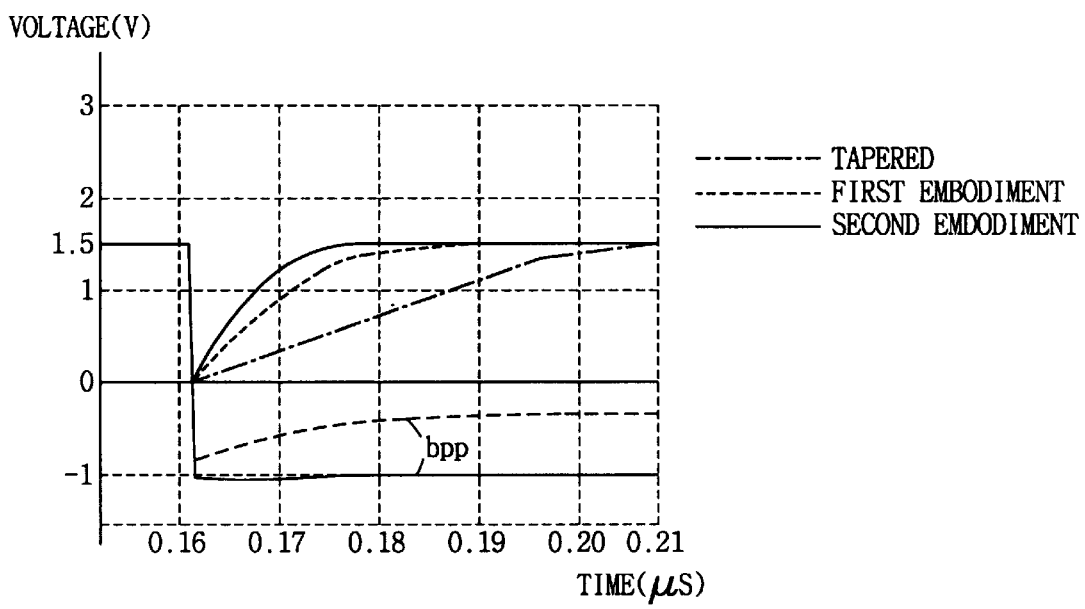
FIGS. 4A and 4B are graphs respectively illustrating pull-up and pull-down wave forms of the bootstrapped CMOM driver according to the second embodiment of the present invention.
Figure 4B:
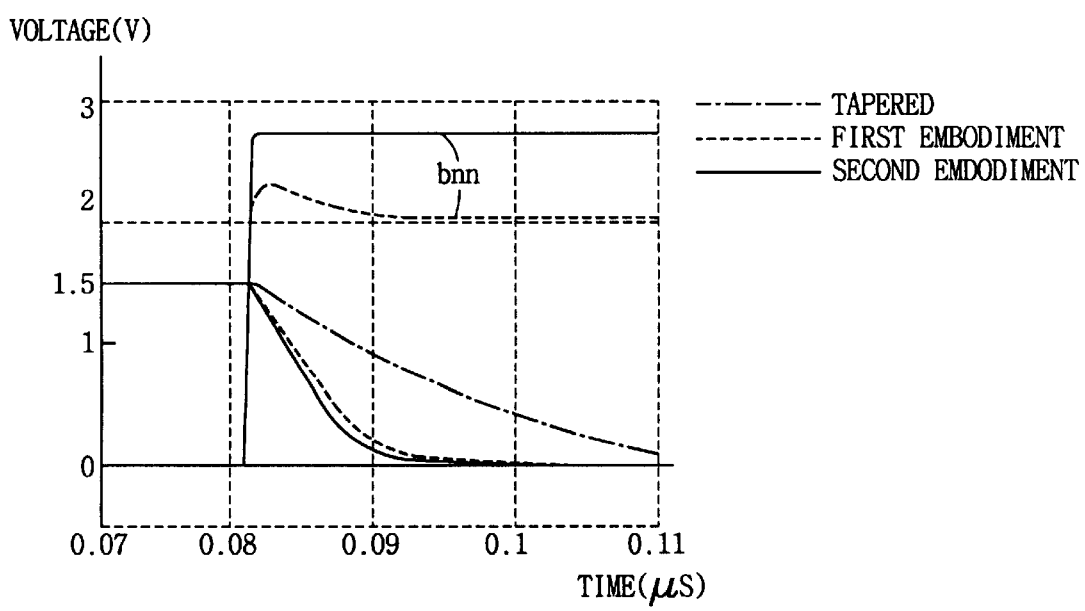

FIGS. 4A and 4B are graphs illustrating simulation waveforms of the pull-up and pull-down devices M1,M2, respectively, of the bootstrapped CMOS driver according to the second embodiment of the present invention. As shown therein, the bootstrap voltage level according to the second embodiment of the present invention improves by 30% at its maximum compared to the first embodiment thereof. Accordingly, in the second embodiment of the present invention the bootstrapped CMOS driver has a relatively small bootstrapped capacitance compared to the first embodiment thereof, thereby stably operating even at a low voltage such as 1.2V.

Figure 5:
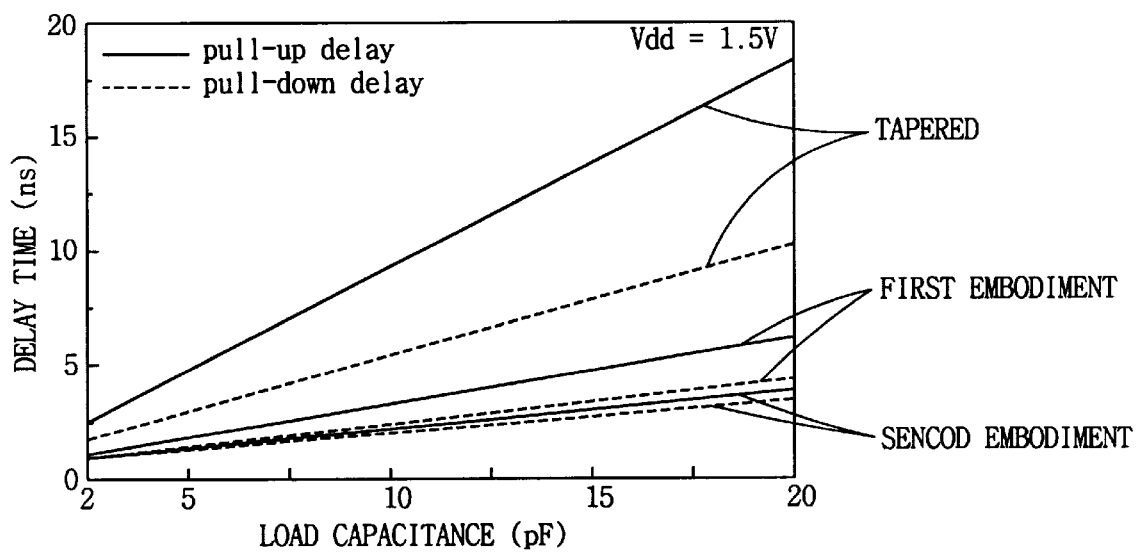
FIG. 5 is a graph illustrating pull-up and pull-down delay times to a load capacitance in the bootstrapped CMOS driver according to the second embodiment of the present invention.

FIG. 5 is a graph illustrating pull-up and pull-down delay times to a load capacitance. As shown therein, the bootstrapped CMOS driver 200 provides switching speeds for pull-up and pull-down transients which are improved by 3.8× and 2.7×, respectively.

As described above, the bootstrapped CMOS driver employing the dual bootstrap capacitors according to the first embodiment of the present invention has an effect of improving a bootstrap efficiency by improving the speed reduction thereof at the low voltage, and the bootstrapped CMOS driver according to the present invention provides the operation speed which is 2.8 to 3.8 times faster than that of the conventional tapered CMOS inverter. In addition, the bootstrapped CMOS driver according to the second embodiment of the present invention provides the better bootstrap efficiency than the first embodiment thereof, and since the bootstrapped CMOS driver according to the second embodiment of the present invention employs the single bootstrap capacitor, thereby minimizing the layout area thereof.

It will be apparent to those skilled in the art that various modifications and variations can be made in the bootstrapped CMOS driver of the present invention without departing from the spirit or scope of the invention. Thus, it is intended that the present invention cover the modifications and variations of this invention provided they come within the scope of the appended claims and their equivalents.

What is claimed is:

1. A bootstrapped CMOS driver, comprising:
a drive unit comprising pull-up and pull-down devices; and
a bootstrap unit that boosts gate voltages of the pull-up and pull-down devices using a pull-up section and a pull-down section performing pull-up and pull-down operations, respectively, in accordance with a level of an input signal, wherein the pull-up section comprises:
first and second MOS devices serially connected between a power voltage terminal and a first node,
a first bootstrap capacitor connected between the first node and a second node, and
a third MOS device a drain and a source of which are connected with the first node and a ground, respectively, and a gate of which is connected with a common drain of the first and second MOS devices and a gate of the pull-up device, and wherein the pull-down section comprises,
a second bootstrap capacitor connected between the second node and a third node,
fourth and fifth MOS devices serially connected between the third node and the ground, and
a sixth MOS device a source and a drain of which are connected with the third node and the ground, respectively, and a gate of which is connected with a common drain of the fourth and fifth MOS devices and a gate of the pull-down device.

2. The bootstrapped CMOS driver of claim 1, wherein the input signal is applied to gates of the first, second, fourth and fifth MOS devices and an inverted signal of the input signal is applied to the second node.

3. The bootstrapped CMOS driver of claim 1, wherein the first, fourth and sixth MOS devices are a p-type and the second, third and fifth MOS devices are an n-type.

4. A bootstrapped CMOS driver, comprising:
a drive unit comprising pull-up and pull-down devices; and
a bootstrap unit that boosts gate voltages of the pull-up and pull-down devices using a pull-up section and a pull-down section, respectively, in accordance with a level of an input signal, wherein the bootstrap unit comprises,
first and second MOS devices serially connected between a power voltage and a first node, each having a drain connected together and connected with the pull-up device,
a third MOS device connected between the power voltage and the first node,
fourth and fifth MOS devices serially connected between the first node and a ground voltage,
a bootstrap capacitor connected between the first node and the second node,
a sixth MOS device connected between the second node and the ground voltage,
seventh and eighth MOS devices serially connected between the power voltage and the second node, and
ninth and tenth MOS devices serially connected between the second node and the ground voltage, each having a drain connected together and connected to the pull-down device.

5. The bootstrapped CMOS driver of claim 4, wherein the first to fifth MOS devices and the bootstrap capacitor constitute the pull-up section and the bootstrap capacitor and the six to tenth MOS devices constitute the pull-down section.

6. The bootstrapped CMOS driver of claim 4, wherein bodies of the second and fourth MOS devices are connected with the first node and bodies of the eighth and ninth MOS devices are connected with the second node.

7. The bootstrapped CMOS driver of claim 4, wherein the bootstrap unit performs the pull-up operation, when only the first input signal becomes a high level between the first and second input signals which are low and high levels, respectively.

8. The bootstrapped CMOS driver of claim 4, wherein the bootstrap unit performs the pull-down operation, when only the second input signal becomes a low level between the first and second input signals which are low and high levels, respectively.

9. The bootstrapped CMOS driver of claim 4, wherein the first, third, and seventh to ninth MOS devices are the p-type and the second, fourth to sixth and tenth MOS devices are the n-type.

10. The bootstrapped CMOS driver of claim 4, wherein the first, second, sixth and seventh MOS devices are controlled by a first input signal, and wherein the third, fifth, ninth and tenth MOS devices are controlled by a second input signal.

11. The bootstrapped CMOS driver of claim 4, wherein a gate of the fourth MOS device is connected with the gate of the pull-up device, and wherein a gate of the eighth MOS device is connected with a gate of the pull-down device.

12. A bootstrapped CMOS driver, comprising:
   a drive unit comprising pull-up and pull-down devices; and
   a bootstrap unit that boosts gate voltages of the pull-up and pull-down devices using a pull-up section and a pull-down section, respectively, in accordance with a level of an input signal, wherein the bootstrap comprises,
      first and second MOS devices coupled in series between a first prescribed voltage terminal and a first node, and each having a second electrode coupled with the pull-up device,
      a third MOS device coupled between the first prescribed voltage terminal and the first node,
      fourth and fifth MOS devices coupled in series between the first node and a second prescribed voltage terminal,
      a bootstrap capacitor coupled between the first node and the second node,
      an eighth MOS device coupled between the first prescribed voltage terminal and the second node, and
      ninth and tenth MOS devices coupled in series between the second node and the second prescribed voltage terminal, each having a second electrode coupled with the pull-down device.

13. The bootstrapped CMOS driver of claim 12, further comprising:
   a sixth MOS device coupled between the second node and the second prescribed voltage terminal; and
   a seventh MOS device coupled in series between the first prescribed voltage terminal and the eighth MOS device.

14. The bootstrapped CMOS driver of claim 13, wherein the first, second, sixth and seventh MOS devices are controlled by a first input signal, and wherein the third, fifth, ninth and tenth MOS devices are controlled by a second input signal.

15. The bootstrapped CMOS driver of claim 13, wherein the first to fifth MOS devices and the bootstrap capacitor comprise the pull-up section, wherein a control electrode of the fourth MOS device is coupled with the pull-up device, wherein the bootstrap capacitor and the six to tenth MOS devices comprise the pull-down section, and wherein a control electrode of the eighth MOS device is coupled with the pull-down device.

16. The bootstrapped CMOS driver of claim 11, wherein the pull-up and pull-down devices are MOS transistors.

* * * * *